United States Patent
Spitzer et al.

(10) Patent No.: US 6,538,437 B2
(45) Date of Patent: Mar. 25, 2003

(54) LOW POWER MAGNETIC ANOMALY SENSOR

(75) Inventors: Richard Spitzer, Berkeley, CA (US); E. James Torok, Shoreview, CA (US)

(73) Assignee: Integrated Magnetoelectronics Corporation, Berkeley, CA (US)

( * ) Notice: Subject to any disclaimer, the term of this patent is extended or adjusted under 35 U.S.C. 154(b) by 0 days.

(21) Appl. No.: 09/883,644

(22) Filed: Jun. 18, 2001

(65) Prior Publication Data

US 2002/0005717 A1 Jan. 17, 2002

Related U.S. Application Data

(60) Provisional application No. 60/217,780, filed on Jul. 11, 2000.

(51) Int. Cl.[7] .................. G01R 33/09; G01R 33/05; G01R 33/022
(52) U.S. Cl. .................. 324/252; 324/249; 324/253
(58) Field of Search .................. 324/249, 252, 324/253; 360/314, 324, 324.1

(56) References Cited

U.S. PATENT DOCUMENTS

| | | | |
|---|---|---|---|
| 3,972,786 A | 8/1976 | Ballard | 204/32 R |
| 4,277,751 A | 7/1981 | Lawson et al. | 324/254 |
| 4,356,523 A | 10/1982 | Yeh | 360/113 |
| 4,384,254 A | 5/1983 | Brown | 324/253 |
| 4,751,677 A | 6/1988 | Daughton et al. | 365/158 |
| 4,887,003 A | 12/1989 | Langdon et al. | 324/253 |
| 4,914,381 A | 4/1990 | Narod | 324/117 R |
| 5,140,267 A * | 8/1992 | Shintaku | 324/248 |
| 5,173,873 A | 12/1992 | Wu et al. | 365/173 |
| 5,519,318 A * | 5/1996 | Koerner et al. | 324/252 |
| 5,561,368 A * | 10/1996 | Dovek et al. | 324/252 |
| 5,565,236 A | 10/1996 | Gambino et al. | 427/130 |
| 5,585,986 A | 12/1996 | Parkin | 360/113 |
| 5,587,973 A | 12/1996 | Torok et al. | 365/158 |
| 5,640,343 A | 6/1997 | Gallagher et al. | 365/171 |
| 5,640,754 A | 6/1997 | Lazzari et al. | 29/603.14 |
| 5,650,889 A | 7/1997 | Yamamoto et al. | 360/97.01 |
| 5,650,958 A | 7/1997 | Gallagher et al. | 365/173 |
| 5,652,445 A | 7/1997 | Johnson | 257/295 |
| 5,654,566 A | 8/1997 | Johnson | 257/295 |
| 5,686,837 A * | 11/1997 | Coehoorn et al. | 324/252 |
| 5,793,697 A | 8/1998 | Scheuerlein | 365/230.07 |
| 6,166,539 A * | 12/2000 | Dahlberg et al. | 324/252 |
| 6,339,328 B1 * | 1/2002 | Keene et al. | 324/248 |

FOREIGN PATENT DOCUMENTS

| | | | | |
|---|---|---|---|---|
| GB | 2202635 A | * | 9/1988 | G01R/33/06 |

OTHER PUBLICATIONS

Kim et al., "GMR Multilayer Device with Ring Type Bridge Structure," IEEE Transactions on Magnetics, vol. 35, No. 5, Sep. 1999, pp. 3646–3648.*

(List continued on next page.)

Primary Examiner—Edward Lefkowitz
Assistant Examiner—Darrell Kinder
(74) Attorney, Agent, or Firm—Beyer Weaver & Thomas, LLP

(57) ABSTRACT

A transpinnor-based magnetometer is provided having four resistive elements exhibiting GMR in a bridge configuration. A bias current is applied to the bridge, yielding an output if the bridge is unbalanced due to changes in the GMR resistors. An oscillating magnetic field is applied inductively to the GMR resistors alternately driving them between saturated magnetic states. The drive conductors are physically arranged so that an external magnetic field will oppose the applied field in two resistors and aid the applied field in the other two. The output is nonzero only when the sum of the applied field and external field exceeds the GMR coercivity in one pair of GMR films and not the other. The frequency of the output signal can be varied by switching the polarity of the bias current and controlling the phase with respect to the drive current.

19 Claims, 6 Drawing Sheets

OTHER PUBLICATIONS

Indeck et al. "A Magentoresistive Gradiometer," IEEE Transactions on Magnetics vol. 24, No. 6, Nov. 1988, pp. 2617–2619.*

Jaquelin K. Spong, et al., "*Giant Magnetoresistive Spin Valve Bridge Sensor*", Mar. 1996, *IEEE Transactions on Magnetics*, vol. 32, No. 2, pp. 366–371.

Mark Johnson, "*The All–Metal Spin Transistor*", May 1994, *IEEE Spectrum*, pp. 47–51.

Mark Johnson, "*Bipolar Spin Switch*", Apr. 16, 1996, *Science*, vol. 260, pp. 320–323.

J.M. Daughton, "*Magnetoresistive Memory Technology*," Jul. 28–Aug. 2, 1991, *Int'l Workshop on Science and Technology of Thin Films for the 21st Century*, vol. 216, pp. 162–168.

K.T.M. Ranmuthu et al., "*New Low Current Memory Modes with Giant Magneto–Resistance Materials*," Apr. 13, 1993, *Digests of International Magnetics Conference*, 2 pages.

J.L. Brown, "*1–Mb Memory Chip Using Giant Magnetoresistive Memory Cells*," Sep. 1994, *IEEE Transactions on Components, Packaging, and Manufacturing Technology*, Part A, vol. 17, No. 3, pp. 373–379.

Paul a. Packan, "*Pushing The Limits*", Sep. 24, 1999. science Mag, vol. 285, pp. 2079–2081.

Lenssen, et al, "*Expectations of MRAM in Comparison With Other Non–Volatile Memory Technologies*", Phillips Research Laboratories, pp. 26–30.

* cited by examiner (a)

(b)

LOW POWER MAGNETIC ANOMALY SENSOR

RELATED APPLICATION DATA

The present application claims priority from U.S. Provisional Patent Application No. 60/217,780 for LOW POWER, SENSITIVE, ACCURATE MAGNETIC GRADIOMETER filed on Jul. 11, 2000, the entire disclosure of which is incorporated herein by reference for all purposes.

BACKGROUND OF THE INVENTION

The present invention relates to sensor for detecting magnetic anomalies, and more specifically, magnetic sensors which take advantage of the property of giant magnetoresistance.

Magnetic sensors are used in a wide variety of applications for detecting magnetic anomalies. An example of a common magnetic sensor is a fluxgate magnetometer. A conventional fluxgate magnetometer 100 wound on a ferrite torus core 102 is shown in FIG. 1. Magnetometer 100 has a drive coil 104 which is driven with a sine wave of frequency f. The function of the drive coil is to alternately saturate the ferrite torus core in the clockwise and counterclockwise directions. A sense coil 106 is also included which senses any net flux in the horizontal direction, i.e., the direction normal to the plane of the sense coil, and only during the time in the drive cycle when the drive current is nearly zero. That is, the horizontal net flux only exists when the current in drive coil 104 is near zero, i.e., at the zero crossings of the sine wave input. Because this occurs twice in each period of the input signal, the frequency of the output signal on sense coil 106 is twice that of the input signal, i.e., $2f$, thus reducing noise on the sensor's output.

FIGS. 2($a$)–2($d$) illustrate the changing magnetic configuration of magnetometer 100 during one period of the input signal. The direction of magnetization is indicated by the arrows superimposed in ferrite core 102. In FIG. 2($a$), the input drive current is maximum and positive resulting in saturation of core 102 in the counterclockwise direction. When the drive current is reduced to zero, the magnetization of core 102 responds to the external field as shown in FIG. 2($b$). When the drive current is maximum and negative, core 102 is saturated in the clockwise direction as shown in FIG. 2($c$). Finally, when the input drive current again reaches zero, the magnetization again responds to the external field (FIG. 2($d$)).

A common application for fluxgate magnetometers is a conventional fluxgate gradiometer as shown in FIG. 3. Gradiometer 300 employs two fluxgate magnetometers 302 and 304 in two different positions and having the same input drive current in drive coil 306. The sense coils 308 and 310 of the magnetometers are connected to a differential amplifier 312, the output of which represents the difference between the magnetic fields at the two magnetometer locations.

Unfortunately, conventional fluxgate magnetometers and the devices of which they are part (e.g., fluxgate gradiometers) suffer from some serious drawbacks. First, these devices are too large and power hungry to be used in microsensing applications. In addition, they can be prohibitively expensive for many applications. Finally, such devices have not heretofore been fabricated using integrated circuit techniques. It is therefore desirable to provide magnetic sensing technology which is inexpensive, suitable for microsensing applications, and amenable to integrated circuit fabrication techniques.

SUMMARY OF THE INVENTION

According to the present invention, magnetic sensing technology is provided operation of which is based on the property of multi-layer magnetic thin film structures known as giant magnetoresistance (GMR). According to a specific embodiment, a magnetic sensor is provided which is based on a GMR device referred to herein as a "transpinnor." A transpinnor is a multi-functional, active solid-state device comprising a network of GMR thin film elements which has characteristics similar to both transistors and transformers. Like a transistor, the transpinnor can be used for power amplification, current amplification, voltage amplification, or logic. Like a transformer, the transpinnor can be used to step voltages and currents up or down with the input resistively isolated from the output.

According to a specific embodiment of the present invention, a transpinnor-based magnetometer is provided having four resistive elements exhibiting GMR in a bridge configuration. Two input conductors are each inductively coupled to two of the resistive elements with a sine-wave drive current applied to one and a bias current applied to the other. When the resistance of the two arms of the bridge are equal, the bridge is balanced and there is no output current. When the field imposed by a magnetic anomaly causes the resistances to become unequal, the bridge is unbalanced and produces an output representative of the external magnetic field.

Thus, the present invention provides a device for sensing a magnetic anomaly which includes a network of thin film elements exhibiting giant magnetoresistance. A first conductor is inductively coupled to a first subset of the thin film elements for supplying a drive current to the device. A second conductor is inductively coupled to a second subset of the thin film elements for providing a bias current to the device. The network of thin film elements generates an output signal in response to an external magnetic field oriented in a first direction relative to the applied drive current, the external magnetic field being representative of the magnetic anomaly.

According to another specific embodiment, a gradiometer is provided also comprising a network of thin film elements exhibiting giant magnetoresistance. A first conductor is inductively coupled to a first subset of the thin film elements for supplying a drive current to the device. A second conductor is inductively coupled to a second subset of the thin film elements for providing a bias current to the device. The network of thin film elements generates an output signal in response to an external magnetic field, the external magnetic field being representative of a magnetic anomaly. The output signal is representative of one component of a gradient tensor associated with the external magnetic field.

According to still further embodiments, a plurality of such gradiometers are configured to detect multiple components of the external field's gradient tensor. According to some of these embodiments, a magnetometer designed according to the invention is also included with the gradiometers, the magnitude data from the magnetometer and spatial derivative data from the multiple gradiometers being combined to determine the size, distance, and direction of travel of the magnetic anomaly.

A further understanding of the nature and advantages of the present invention may be realized by reference to the remaining portions of the specification and the drawings.

DETAILED DESCRIPTION OF SPECIFIC EMBODIMENTS

As mentioned above, the present invention takes advantage of the property of giant magnetoresistance (GMR) in thin film structures comprising alternating magnetic and nonmagnetic metallic layers. When the magnetic layers of such a structure are magnetized in the same direction, the resistance of the structure is lower than when the layers are magnetized in opposing directions. This is due to the fact that conduction electrons in magnetic materials are spin-polarized in the same direction as the electrons causing the magnetization. When adjacent magnetic layers are magnetized in different directions, conduction electrons moving between the adjacent layers encounter high interface scattering and there is a corresponding increase in the overall resistance of the film. Significant changes in resistance in such structures can result from the application of magnetic fields that partially or fully switch selected layers.

A transpinnor is a multifunctional, active GMR device comprising a network of GMR thin film structures and with characteristics similar to both transistors and transformers. Like a transistor, it can be used for amplification, logic, or switching. Like a transformer, the transpinnor can be used to step voltages and currents up or down, with the input resistively isolated from the output. Like a transistor, a transpinnor can be integrated in a small space. Unlike conventional transformers, a transpinnor has no low frequency cutoff, the coupling being flat down to and including DC. In addition, the operational characteristics of the transpinnor (including amplification, current requirements, and speed) tend to improve as its dimensions get smaller. For more information on transpinnors, please refer to U.S. Pat. No. 5,929,636 for ALL-METAL, GIANT MAGNETORESISTIVE, SOLID-STATE COMPONENT issued Jul. 27, 1999, the entire disclosure of which is incorporated herein by reference for all purposes.

Figure 1:
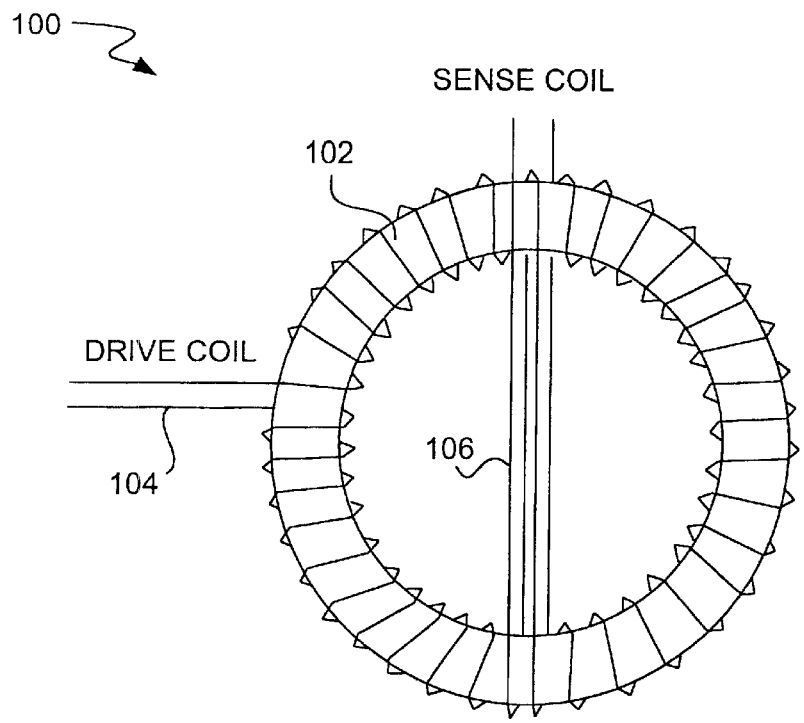
FIG. 1 is a depiction of a conventional fluxgate magnetometer.
Figure 2:
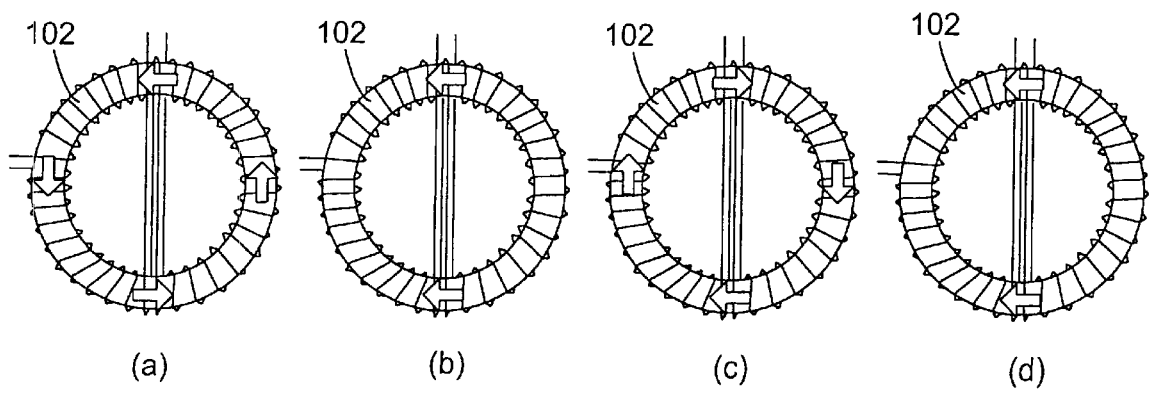
FIG. 2 illustrates the magnetization of a conventional fluxgate magnetometer at various points during one period of drive current.
Figure 3:
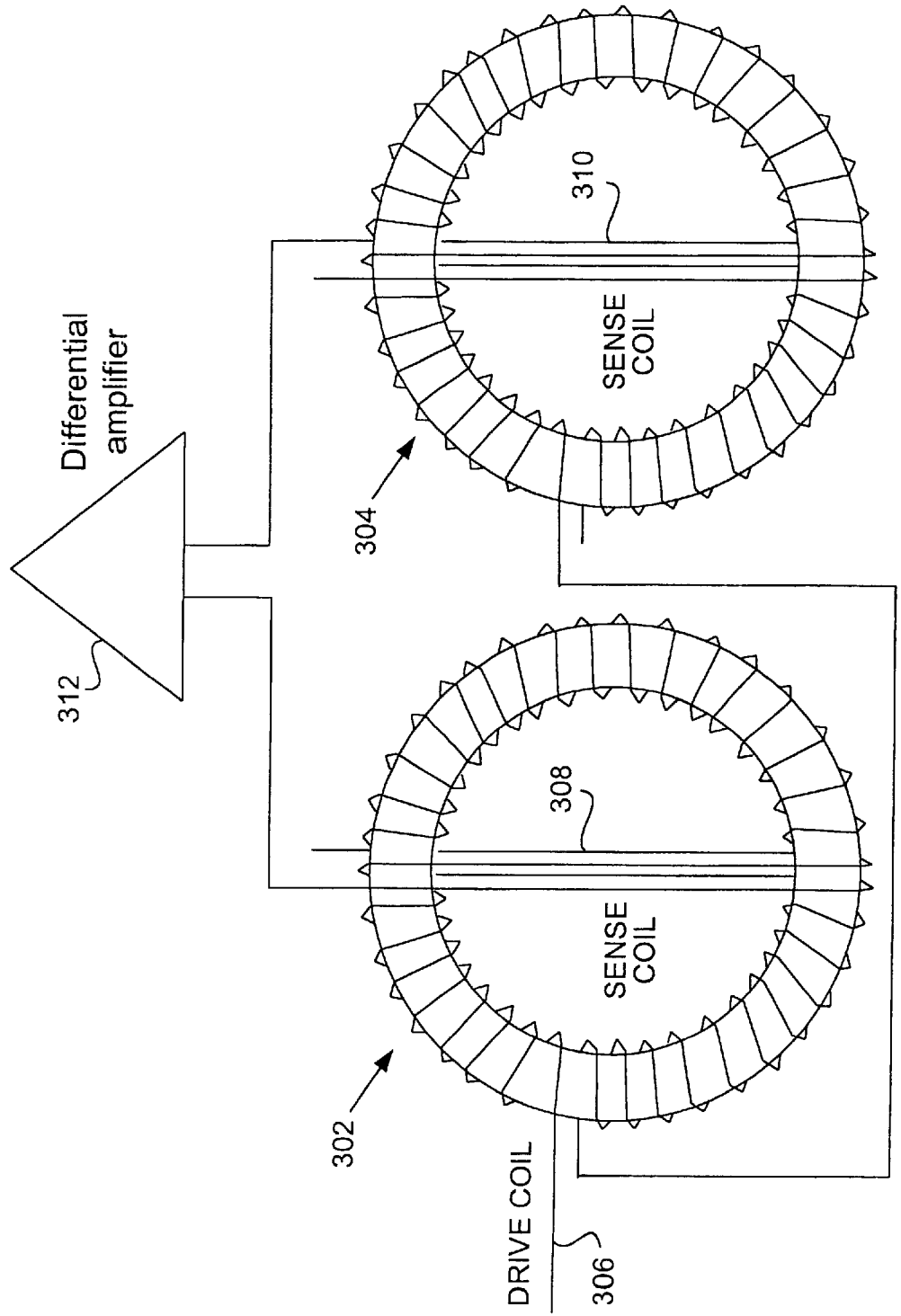
FIG. 3 is a depiction of a conventional fluxgate gradiometer.
Figure 4:
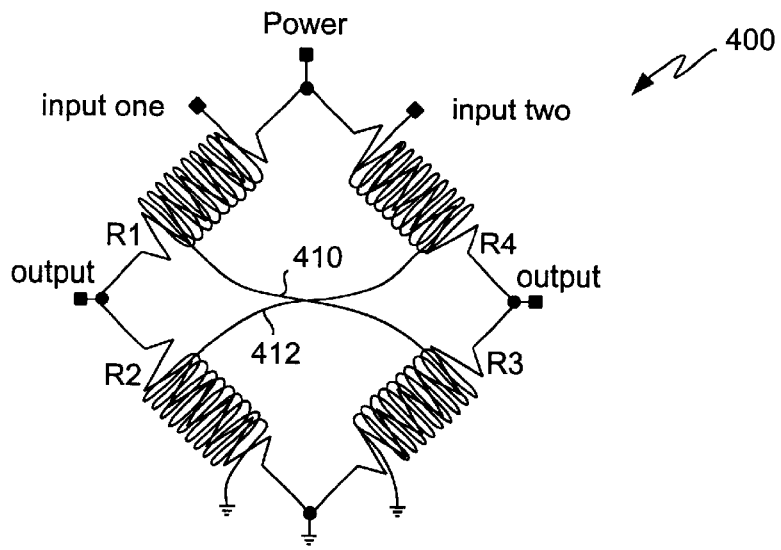
FIG. 4 is a depiction of a GMR transpinnor.

A specific implementation of a transpinnor 400 is shown schematically in FIG. 4. Four resistive elements R1–R4 comprising GMR film structures are configured as a Wheatstone bridge. Current in either of input lines 410 or 412 creates a magnetic field of one or more of GMR films R1–R4. This unbalances the bridge and creates an output signal between output terminals 414 and 416. In the transpinnor implementation of FIG. 4 input lines 410 and 412 are shown inductively coupled to resistive elements R1–R4 with coils. According to the integrated circuit embodiments described herein, this coupling is achieved using striplines.

As mentioned above, the resistance of each leg of transpinnor 400 may be changed by application of a magnetic field to manipulate the magnetization vectors of the respective GMR film's layers. Such fields are generated by the application of currents in input lines 410 and 412 which are insulated from the GMR films. Input line 410 is coupled to and provides magnetic fields for altering the resistance of GMR films R1 and R3. Input line 412 is coupled to and provides magnetic fields for altering the resistance of GMR films R2 and R4. If the resistances of all four GMR films are identical, equal currents in input lines 410 and 412 change the resistances equally and do not unbalance the bridge, thus resulting in zero output. If, however, unequal currents are applied, an imbalance results, thus resulting in a nonzero output.

A transpinnor-based magnetometer 500 fabricated using integrated circuit techniques will now be described with reference to FIG. 5. Magnetometer 500 is a dual-input device with a sine-wave current being applied at applied field input 502 and a bias current at bias current input 504. Four multi-layer thin film GMR resistive elements R1–R4 are arranged in a Wheatstone bridge configuration. Each of resistive elements R1–R4 comprises at least one high coercivity layer, e.g., cobalt, and at least one low coercivity layer, e.g., permalloy, alternating with nonmagnetic conductors, e.g., copper.

When the resistances of the bridge's two arms are equal, the bridge is balanced and there is no output current. When the field of a magnetic anomaly causes the resistances to become unequal, the bridge becomes unbalanced and produces an output current. Magnetometer 500 is sensitive to external fields perpendicular to the direction of the applied field drive current.

When the resistive elements of each leg of magnetometer 500 are in the same magnetic state, its output should be zero. However, because of imperfections arising in the fabrication process, the resistances will typically vary slightly resulting in a nonzero output even where there is no external field due to a magnetic anomaly present. Therefore, according to a specific embodiment of the present invention, one or more of the resistive elements of magnetometer 500 may be trimmed to compensate for this imbalance.

That is, compensation for any resistive imbalance is achieved by reducing the output of the transpinnor through partial or full reversal of the magnetization vector of at least one of the high coercivity layers in at least one of the resistive elements. By reversing just the right percentage of the cobalt layer, the output of the transpinnor is made to go to zero when there are no magnetic anomalies present, i.e., when it is supposed to be zero. Additional information about the resistive trimming of GMR structures is described in commonly owned, copending U.S. patent application Ser. No. 09/883645 for MAGNETORESISTIVE TRIMMING OF GMR CIRCUITS (attorney docket no. IMECP007) filed on Jun. 18, 2001, the entire disclosure of which is incorporated herein by reference for all purposes.

Referring once again to FIG. 5, a driving sine-wave current is applied at applied field input 502. The magnetic field from this current saturates GMR resistive elements R1–R4 at both the positive and negative peaks of the sine wave. In between, the GMR resistive elements go through a B-H loop as shown in FIG. 6(a). Note that if an external magnetic field (e.g., the earth's magnetic field) aids the applied field from a positive current in resistive elements R1 and R3, then that external field opposes the field from the applied field current in resistive elements R2 and R4. When the applied field current is negative, the opposite is true. Thus, as shown in FIG. 6(a), the hysteresis loop for R1 and R3 is different from that for R2 and R4, and the loops are temporally separated. This difference causes the bridge to be unbalanced for a period of time corresponding to the temporal separation of the two hysteresis loops, resulting in an output pulse during that period of time as shown in FIG. 6(b). An external field due to the presence of a magnetic anomaly would increase this effect in direct proportion to the magnitude of the external field.

As mentioned above, the GMR resistive elements of magnetometer 500 have multiple magnetic layers including high and low coercivity layers. The low coercivity layers switch at lower field magnitudes than the high coercivity layers. When the magnitude of the applied field is high enough to switch the low coercivity layer such that its magnetization is antiparallel to the magnetization of the high coercivity layer, the resistance of the GMR film is raised. As the magnitude of the applied field continues to increase, the high coercivity layer eventually switches such that its magnetization is again parallel to that of the low coercivity layer and the resistance is lowered. In addition and for the purpose of discussion, the convention is adopted herein that when the bias current is positive and the resistance of R2 and R4 is greater than the resistance of R1 and R3, the output current is positive. If the reverse is true, the polarity of the output current is negative.

The output of magnetometer 500 over a full period of the applied field current and in the presence of a magnetic anomaly is shown in FIG. 6(b). In this example, the bias current is assumed to be constant. The input begins as a large positive applied field current (the far right of the graph), is reduced to zero, reversed in polarity, and increased in the negative direction until the low coercivity layers in resistive elements R2 and R4 switch, becoming antiparallel to the high coercivity layers, raising the resistances of R2 and R4, unbalancing the bridge and creating a positive output magnetometer (leading edge of current pulse 602). The low coercivity layers of resistive elements R1 and R3 do not switch at this point due to the temporal separation between the hysteresis curves caused by the presence of the magnetic anomaly and described above with reference to FIG. 6(a). The width of the current pulse, i.e., the temporal separation, depends on the magnitude of the field associated with the magnetic anomaly.

As the magnitude of the applied field current increases in the negative direction, the low coercivity layers of resistive elements R1 and R3 eventually switch, increasing the resistances of R1 and R3, balancing the bridge again, and reducing the magnetometer output to zero (trailing edge of current pulse 602).

As the magnitude of the applied field current continues to increase in the negative direction, the high coercivity layers of R2 and R4 switch, becoming parallel to the corresponding low coercivity layers, and decreasing the resistances of R2 and R4. This unbalances the bridge once again, generating a negative output (leading edge of current pulse 604). At a slightly more negative applied field current magnitude (again due to the temporal separation), the high coercivity layers of R1 and R3 switch, becoming parallel to their associated low coercivity layers, balancing the bridge, and thereby bringing the output back to zero (trailing edge of current pulse 604).

A similar series of events occurs in the presence of a magnetic anomaly as the applied field current swings positive. That is, the applied field current reaches its negative peak, is reduced to zero, reversed in polarity, and increased in the positive direction. First, the low coercivity layers of R1 and R3 switch followed by the low coercivity layers of R2 and R4. This results in a temporary imbalance of the magnetometer bridge which is manifested as negative output current pulse 606. As the applied field current continues to increase in magnitude, the high coercivity layers of R1 and R3 switch followed by the high coercivity layers of R2 and R4. This results in another bridge imbalance manifested in positive output current pulse 608. The entire sequence is repeated with each input current period.

Figure 7:
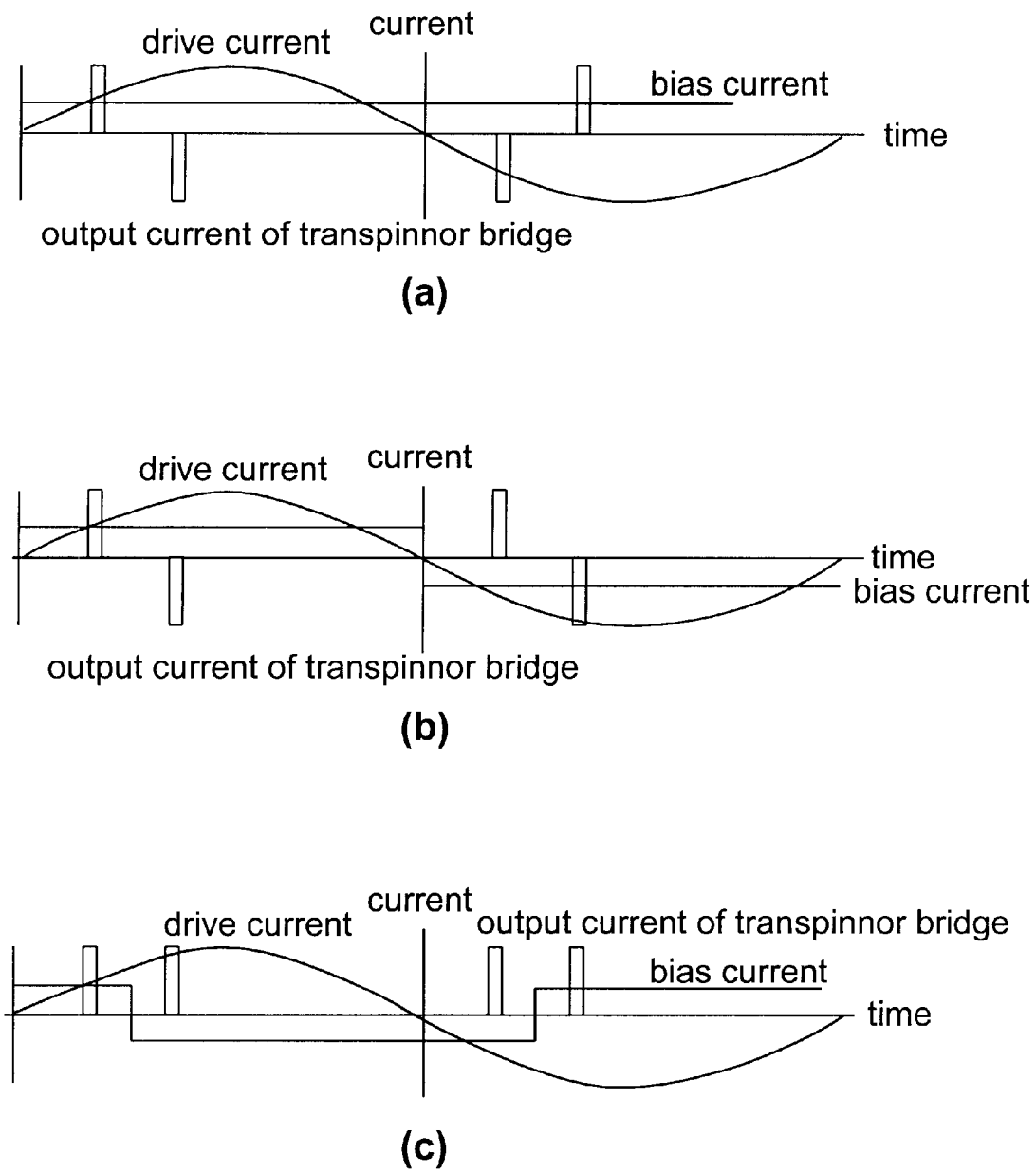
FIGS. 7(a)–7(c) are graphs illustrating the relationship between the output current and the applied field current of a transpinnor magnetometer for three different bias currents according to various embodiments of the invention.

FIGS. 7(a)–7(c) are graphs illustrating the relationship between the output current and the applied field current of a transpinnor magnetometer for three different bias currents plotted as a function of time. FIG. 7(a) shows the case for a constant bias current. The output is proportional to the bias current and the polarity of the output current switches with the polarity of the drive current, i.e., the period of the output current is the same as the drive current.

FIG. 7(b) shows the case where the polarity of the bias current switches with the polarity of the drive current. The result is a bipolar output current at twice the frequency of the drive current similar to a conventional fluxgate magnetometer. This facilitates phase-locked frequency detection of the signal without noise contamination from the fundamental, thus allowing detection of fields many orders of magnitude below the coercivity of the magnetic elements of the magnetometer.

FIG. 7(c) shows the case where the polarity of the bias current is switched between the time the low coercivity layers of the bridge switch and the time the high coercivity layers of the bridge switch. The output is four unipolar pulses per cycle, all positive. This output waveform has various Fourier components, one of which is a d.c. component. This d.c. component makes detection of the signal particularly simple because there is no d.c. component in the output unless there is a magnetic field to be detected. Whether or not the drive currents have harmonic distortion is immaterial, and will not give a spurious d.c. output. This removes the necessity for harmonic filtering. This is advantageous in that the requirement for careful filtering is one of the factors which makes conventional fluxgate magnetometers so expensive. This embodiment requires only alternating current as its input and produces a direct current output. This yields savings in weight, complexity, cost, and an increase in sensitivity.

In general, the transpinnor acts as a mixer, generating an output containing sum and difference frequencies of the bias and input currents. By selecting a difference frequency that is not in either the bias or input current, one can get an output free of harmonic noise. Put another way, to achieve this effect at the output, the bias and input currents are controlled such that neither is at a frequency that is an integral multiple of the other.

Figure 8:
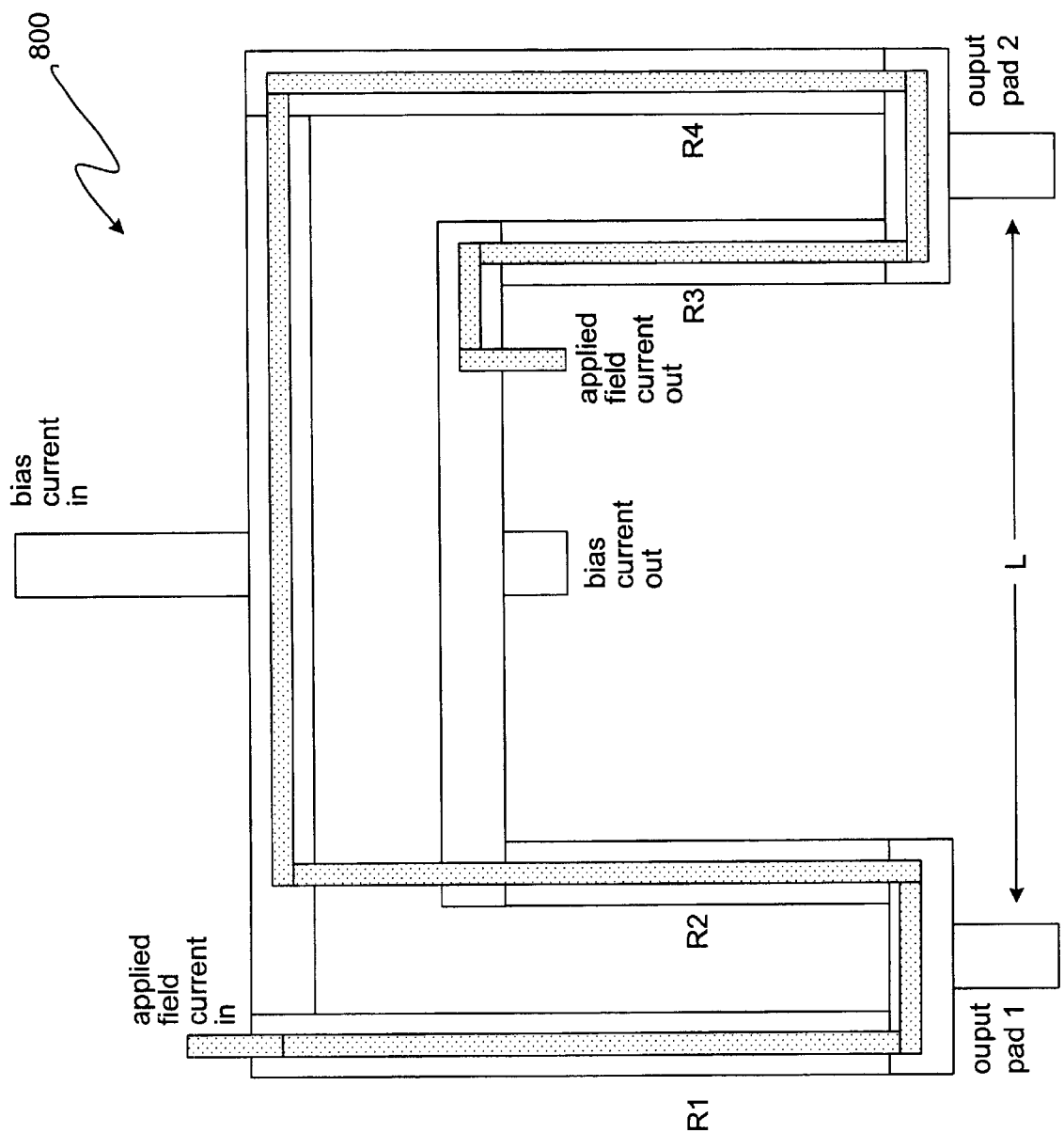
FIG. 8 is a depiction of a transpinnor gradiometer designed according to another specific embodiment of the present invention.

FIG. 8 shows an example of a transpinnor–based gradiometer 800 designed according to a specific embodiment of the present invention. Gradiometer 800 gives zero output current for a constant magnetic field, being sensitive only to the component of the spatial derivative of the magnetic field along the sense direction. Note that in FIG. 8 the direction of the applied field on the right hand side of the bridge is reversed from that in FIG. 5. The result is to make both the right and left hand sides of the bridge react in the same way to a spatially constant magnetic field, so that the bridge is unbalanced only if the magnetic field is different on the left hand side of the bridge than on the right. Gradiometer 800 is therefore sensitive only to the component of the spatial derivative of the magnetic field along the sense direction (i.e., the horizontal direction in FIG. 8).

One of the uses for a gradiometer is to detect whether a vehicle has moved to a location near the detector. If one tries to use a magnetometer for this, and look for time dependent changes in output, one runs into trouble because the earth's magnetic field actually changes in time. Thus, when the output of a magnetometer changes, there is no way of knowing whether the earth's field changed or whether a vehicle moved nearby. There is an advantage to using a gradiometer instead because a nearby vehicle produces a magnetic field with a spatial gradient while the earth's magnetic field has virtually none.

According to a specific embodiment, multiple gradiometers, each sensitive to one of the nine components of the gradient tensor $MH_i/Mx_j$. The sensitivity of each gradiometer is set by configuring each device in the direction of its corresponding tensor component, e.g., by appropriately configuring the orientation of the arms of each device. According to various embodiments, such arrays of gradiometers comprise nine or fewer gradiometers, depending upon how many of the derivatives are significant for a given application.

Figure 5:
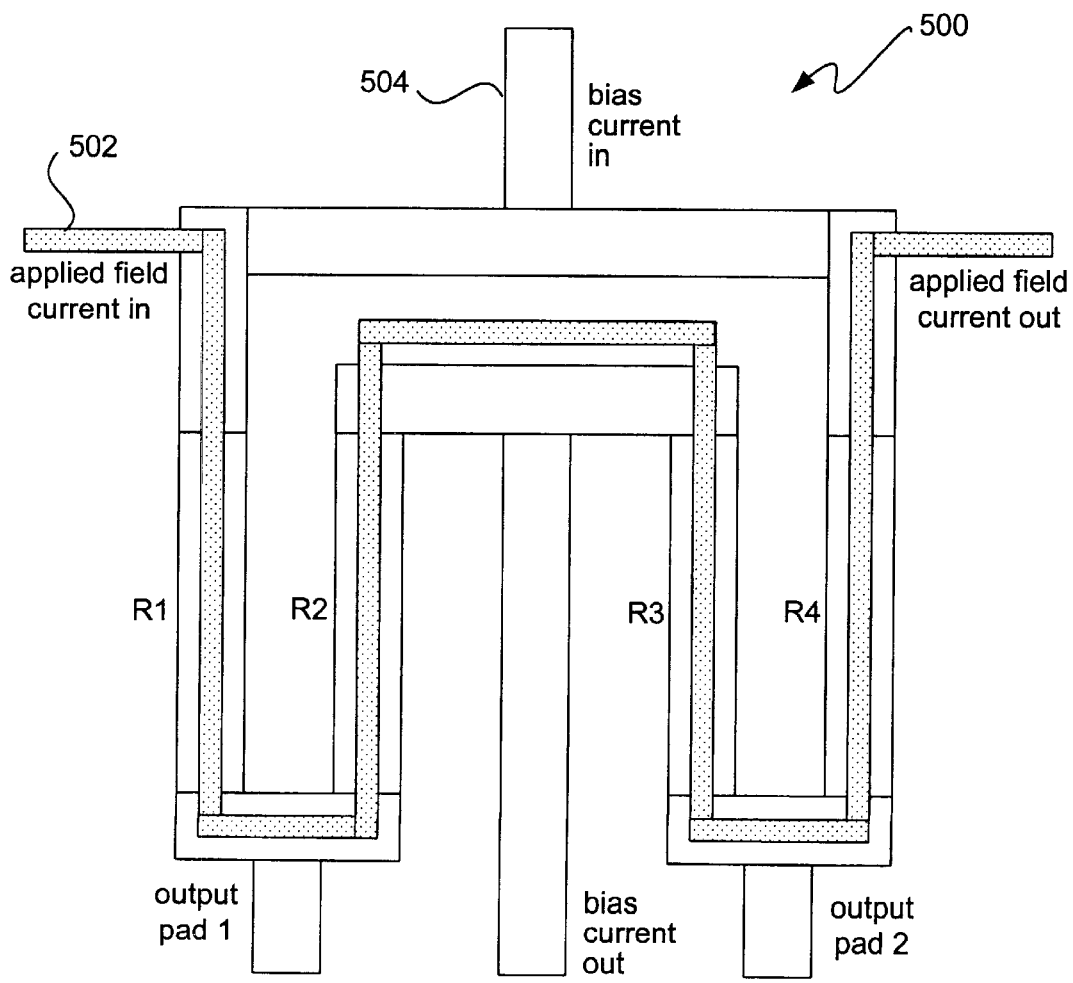
FIG. 5 is a depiction of a transpinnor magnetometer designed according to a specific embodiment of the present invention.
Figure 6:
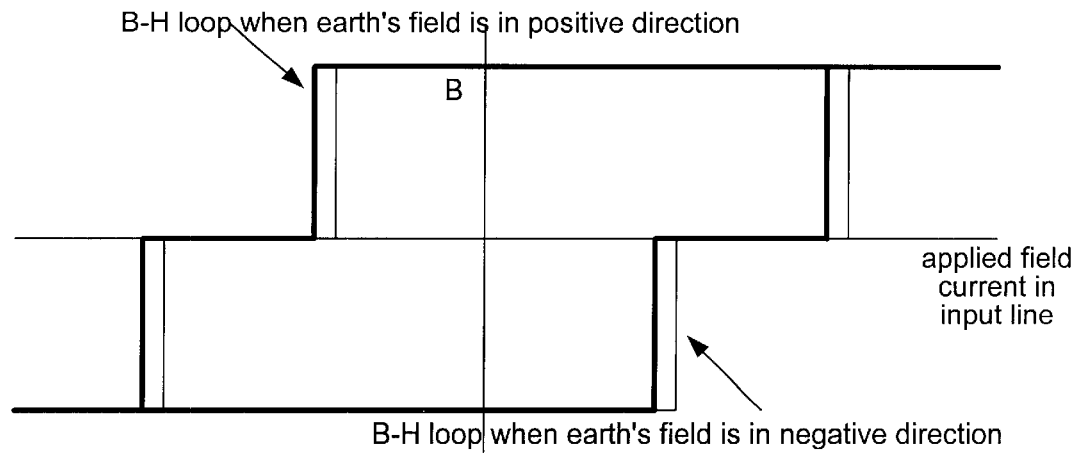
FIG. 6(a) is a graph illustrating the hysteresis loops of the GMR elements of a transpinnor magnetometer designed according to a specific embodiment of the invention.
FIG. 6(b) is a graph illustrating the relationship between the output current and the applied field current of a transpinnor magnetometer designed according to a specific embodiment of the invention.
Figure 6:
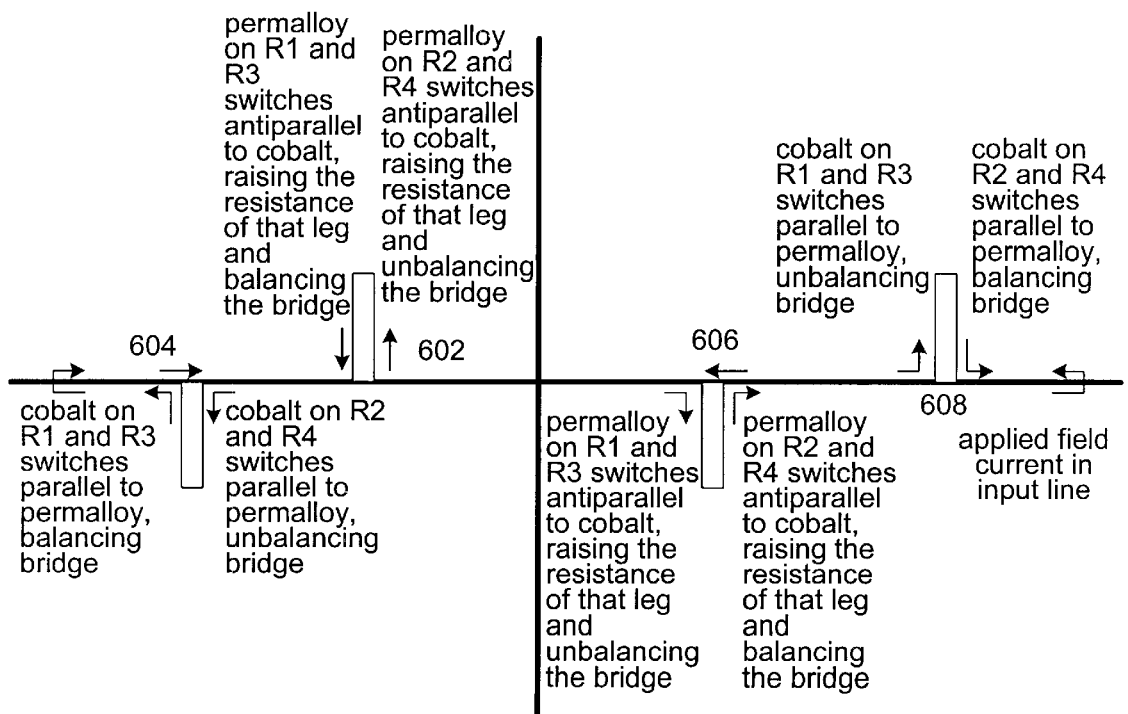

According to a more specific embodiment, the data from an array of gradiometers is combined with the data from a transpinnor magnetometer, e.g., magnetometer 500 of FIG. 5, to provide information regarding the physical size of a magnetic anomaly and its distance from the sensors. That is, the magnitude information provided by the magnetometer may be combined with the spatial derivative information from the array of gradiometers to distinguish, for example, whether a sensed magnetic anomaly is an armed soldier 3 meters away, a jeep 30 meters away, or a tank 100 meters away. These data may also be used to determine the direction of motion of the magnetic anomaly.

According to such embodiments, the distance between the detector and the magnetic anomaly may be determined from the ratio of the magnitudes of the anomaly's magnetic field and the gradient. This is because the magnitude of the magnetic field drops off as the inverse cube of the distance while the first derivative drops off as the inverse fourth power.

The direction of the anomaly relative to the detector may be determined by identifying the direction in which the gradient is largest. According to one embodiment, nine gradiometers, each sensitive to a different one of the nine components of the gradient tensor are provided. According to other embodiments, fewer than nine gradiometers are used, e.g., only those associated with the planar direction.

The sensitivity of a gradiometer designed according to the present invention is proportional to the separation between the arms of the gradiometer. According to specific embodiments, the arms of a single gradiometer may be placed on two separate chips to achieve the desired distance.

In addition and as discussed above with reference to magnetometer 500 and FIG. 7(c), a gradiometer designed according to the present invention may be similarly configured and driven such that an alternating current input produces a direct current output. This eliminates the need for tank circuit filtering and results in a very sensitive, inexpensive device. This is important in applications where the need for many such sensors is anticipated.

While the invention has been particularly shown and described with reference to specific embodiments thereof, it will be understood by those skilled in the art that changes in the form and details of the disclosed embodiments may be made without departing from the spirit or scope of the invention. For example, specific embodiments have been described herein with reference to the use of cobalt and permalloy magnetic materials. It will be understood, however, that other magnetic materials may be employed to construct GMR structures for use with the present invention and remain within its scope.

In addition, magnetic sensing systems have been described having combinations of magnetometers and gradiometers including, for example, an embodiment with nine gradiometers corresponding to the nine components of the gradient tensor. It will be understood, however, that embodiments with fewer gradiometers are contemplated, it being recognized that for some applications, a fewer number of the gradient tensor components are significant. Therefore, the scope of the invention should be determined with reference to the appended claims.

What is claimed is:

1. A device for sensing a magnetic anomaly, comprising:
   a drive current source for providing a drive current;
   a bias current source for providing a bias current;
   a network of thin film elements exhibiting giant magnetoresistance;
   a first conductor inductively coupled to a first subset of the thin film elements for supplying the drive current to the device; and
   a second conductor coupled to a second subset of the thin film elements for providing the bias current to the device;
   wherein the network of thin film elements generates an output signal in response to an external magnetic field oriented in a first direction relative to the applied drive current, the external magnetic field being representative of the magnetic anomaly, and wherein the drive current source and bias current source are operable to control the drive current and the bias current, respectively, such that neither of the drive current and the bias current is at a frequency 2. The device of claim 1 wherein the network of thin film elements comprises four thin film elements in a bridge configuration, the first conductor being inductively coupled to each of the four thin film elements, the second conductor also being coupled to each of the four thin film elements.

3. The device of claim 1 wherein each of the thin film elements comprises a plurality of magnetic and nonmagnetic layers.

4. The device of claim 3 wherein selected ones of the magnetic layers have different coercivities.

5. The device of claim 4 wherein some of the magnetic layers comprise cobalt.

6. The device of claim 4 wherein some of the magnetic layers comprise permalloy.

7. The device of claim 3 wherein some of the nonmagnetic layers comprise copper.

8. The device of claim 3 wherein each of the thin film elements comprises one instance of the magnetic and nonmagnetic layers.

9. The device of claim 3 wherein each of the thin film elements comprises multiple instances of the magnetic and nonmagnetic layers.

10. The device of claim 1 wherein each thin film element comprises at least one high coercivity layer and at least one low coercivity layer, a resistance value associated with each thin film element being configurable by at least partially switching a first magnetization vector associated with the high coercivity layer.

11. The device of claim 1 wherein the network of thin film elements comprises four thin film elements in a bridge configuration, the device being configured such that the output signal is nonzero when the bridge configuration becomes unbalanced, the bridge configuration becoming unbalanced when first magnetization vectors associated with some of the thin film elements oppose corresponding second magnetization vectors associated with others of the thin film elements.

12. A device for sensing a magnetic anomaly comprising:
    a drive current source for providing a drive current;
    a bias current source for providing a bias current;
    a network of thin film elements exhibiting giant magnetoresistance;
    a first conductor inductively coupled to a first subset of the thin film elements for supplying the drive current to the device; and
    a second conductor coupled to a second subset of the thin film elements for providing the bias current to the device;
    wherein the network of thin film elements generates an output signal in response to an external magnetic field, the external magnetic field being representative of the magnetic anomaly, the output signal being representative of one component of a gradient tensor associated with the external magnetic field, and wherein the drive current source and bias current source are operable to control the drive current and the bias current, respectively, such that neither of the drive current and the bias current is at a frequency that is an integral multiple of the other.

13. A device for sensing a magnetic anomaly comprising a drive current source for providing a drive current, a bias current source for providing a bias current, and a plurality of gradiometers, each gradiometer comprising a network of thin film elements exhibiting giant magnetoresistance, a first conductor inductively coupled to a first subset of the thin film elements for supplying the drive current to the device, and a second conductor coupled to a second subset of the thin film elements for providing the bias current to the device, wherein the network of thin film elements in each gradiometer generates an output signal in response to an external magnetic field, the external magnetic field being representative of the magnetic anomaly, the output signal being representative of one of a plurality of components of a gradient tensor associated with the external magnetic field, and wherein the drive current source and bias current source are operable to control the drive current and the bias current, respectively, such that neither of the drive current and the bias current is at a frequency that is an integral multiple of the other.

14. A device for sensing a magnetic anomaly, the device comprising a drive current source for providing a first drive current, a bias current source for providing a first bias current, and a magnetometer, the magnetometer comprising a first network of thin film elements exhibiting giant magnetoresistance, a first conductor inductively coupled to a first subset of the thin film elements in the first network for supplying the first drive current to the magnetometer, and a second conductor coupled to a second subset of the thin film elements in the first network for providing the first bias current to the magnetometer, wherein the first network of thin film elements generates a first output signal representative of a magnitude of an external magnetic field associated the magnetic anomaly, and wherein the drive current source and bias current source are operable to control the first drive current and the first bias current, respectively, such that neither of the first drive current and the first bias current is at a frequency that is an integral multiple of the other, the device also comprising a plurality of gradiometers, each gradiometer comprising a second network of thin film elements exhibiting giant magnetoresistance, a third conductor inductively coupled to a first subset of the thin film elements of the second network for supplying a second drive current to the gradiometer, and a fourth conductor coupled to a second subset of the thin film elements of the second network for providing a second bias current to the gradiometer, wherein the second network of thin film elements in each gradiometer generates a second output signal in response to the external magnetic field, the second output signal being representative of one of a plurality of components of a gradient tensor associated with the external magnetic field.

15. A method for driving a device for sensing a magnetic anomaly, the device comprising a network of thin film elements exhibiting giant magnetoresistance and configured in a bridge configuration, a first conductor inductively coupled to each of the thin film elements for supplying a drive current to the device, and a second conductor coupled to each of the thin film elements for providing a bias current to the device, the method comprising:
    applying the bias current to the device via the second conductor; and
    applying the drive current to the device via the first conductor, the drive current being periodic and having a frequency and a first magnetic field associated therewith;
    wherein the first magnetic field associated with the drive current causes the bridge to become resistively unbalanced for a plurality of periods of time during each drive current period when an external magnetic field is present, each period of time corresponding to a pulse of an output signal having a duration associated therewith, and wherein the drive current and bias current are controlled such that neither of the drive current and the bias current is at a frequency that is an integral multiple of the other.

16. A method for driving a device for sensing a magnetic anomaly, the device comprising a network of thin film elements exhibiting giant magnetoresistance and configured in a bridge configuration, a first conductor inductively coupled to each of the thin film elements for supplying a drive current to the device, and a second conductor coupled to each of the thin film elements for providing a bias current to the device, the method comprising:
    applying the drive current to the device via the first conductor, the drive current being periodic and having a frequency and a first magnetic field associated therewith; and
    applying a bipolar current to the device as the bias current via the second conductor, the polarity of the bipolar current matching the polarity of the drive current;
    wherein the first magnetic field associated with the drive current causes the bridge to become resistively unbalanced for a plurality of periods of time during each drive current period when an external magnetic field is present, each period of time corresponding to a pulse of an output signal having a duration associated therewith, the output signal comprising a bipolar signal at twice the frequency of the drive current.

17. A method for driving a device for sensing a magnetic anomaly, the device comprising a network of thin film elements exhibiting giant magnetoresistance and configured in a bridge configuration, a first conductor inductively coupled to each of the thin film elements for supplying a drive current to the device, and a second conductor coupled to each of the thin film elements for providing a bias current to the device, the method comprising:

applying the drive current to the device via the first conductor, the drive current being periodic and having a frequency and a first magnetic field associated therewith; and applying a bipolar current to the device as the bias current via the second conductor;

wherein the first magnetic field associated with the drive current causes the bridge to become resistively unbalanced for a plurality of periods of time during each drive current period when an external magnetic field is present, each period of time corresponding to a pulse of an output signal having a duration associated therewith, and wherein the polarity of the bipolar current is controlled such that the output signal comprises a unipolar signal.

18. The method of claim 17 wherein applying the bipolar current comprises switching the polarity of the bipolar current between selected ones of the output signal pulses.

19. The method of claim, 17 wherein applying the bipolar current comprises switching the polarity of the bipolar current to generate the output signal having a frequency component which is not present in either of the drive current and the bias current.

* * * * *

UNITED STATES PATENT AND TRADEMARK OFFICE
CERTIFICATE OF CORRECTION

PATENT NO.     : 6,538,437 B2
DATED          : March 25, 2003
INVENTOR(S)    : Spitzer et al.

It is certified that error appears in the above-identified patent and that said Letters Patent is hereby corrected as shown below:

Column 8,
Line 45, after "frequency" add -- that is an integral multiple of the other. --

Signed and Sealed this

Eighth Day of July, 2003

JAMES E. ROGAN
*Director of the United States Patent and Trademark Office*